(12) United States Patent
Kang et al.

(10) Patent No.: US 9,274,389 B2
(45) Date of Patent: Mar. 1, 2016

(54) FLAT DISPLAY DEVICE HAVING A PLURALITY OF LINK LINES AND METHOD OF FABRICATING THE SAME

(75) Inventors: Sung-Gu Kang, Gumi-si (KR); Sung-Il Park, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 140 days.

(21) Appl. No.: 13/330,328

(22) Filed: Dec. 19, 2011

(65) Prior Publication Data

US 2012/0313905 A1 Dec. 13, 2012

(30) Foreign Application Priority Data

Jun. 10, 2011 (KR) .................. 10-2011-0055876

(51) Int. Cl.
*G09G 5/00* (2006.01)
*G02F 1/1345* (2006.01)
*H01L 27/12* (2006.01)
*H01L 27/32* (2006.01)

(52) U.S. Cl.
CPC ............. *G02F 1/1345* (2013.01); *H01L 27/124* (2013.01); *H01L 27/3276* (2013.01)

(58) Field of Classification Search
CPC ............. G02F 1/13452; G02F 1/1345; G09G 2300/0426
See application file for complete search history.

(56) References Cited

U.S. PATENT DOCUMENTS

| | | | | |
|---|---|---|---|---|
| 6,639,589 B1 * | 10/2003 | Kim et al. | ....... | 345/206 |
| 7,026,754 B2 * | 4/2006 | Nakanishi | ....... | 313/500 |
| 7,787,095 B2 * | 8/2010 | Lim | ....... | 349/152 |
| 2005/0286004 A1 * | 12/2005 | Lee | ....... | 349/148 |
| 2008/0002133 A1 * | 1/2008 | Lin et al. | ....... | 349/152 |
| 2009/0091671 A1 * | 4/2009 | Tsubata et al. | ....... | 349/38 |
| 2010/0073622 A1 * | 3/2010 | Ahn | ....... | 349/190 |
| 2011/0109866 A1 * | 5/2011 | Ko et al. | ....... | 349/153 |
| 2011/0221719 A1 * | 9/2011 | Kim et al. | ....... | 345/205 |

FOREIGN PATENT DOCUMENTS

| | | |
|---|---|---|
| CN | 101728344 A | 6/2010 |
| CN | 102314003 A | 1/2012 |
| JP | 2008-3118 A | 1/2008 |
| TW | 200925748 | 6/2009 |
| TW | 201118845 A1 | 6/2011 |

* cited by examiner

*Primary Examiner* — Kathy Wang-Hurst
*Assistant Examiner* — Jose Soto Lopez
(74) *Attorney, Agent, or Firm* — Birch, Stewart, Kolasch & Birch, LLP

(57) ABSTRACT

The present invention relates to a flat display device and method of fabricating the same which can make narrow bezel design easy and minimize resistance variation between adjacent link lines for improving of a picture quality. The flat display device includes a display region having a plurality of pixels, a driving integrated circuit for forwarding driving signals for driving the plurality of pixels, and a plurality of link lines for transmitting the driving signals to the display region, wherein each of the plurality of link lines includes a first metal line, a second metal line formed on a layer different from the first metal line, and a contact portion for connecting the first and second metal lines to each other.

9 Claims, 9 Drawing Sheets

∴ a:b = d:c

US 9,274,389 B2

FLAT DISPLAY DEVICE HAVING A PLURALITY OF LINK LINES AND METHOD OF FABRICATING THE SAME

CROSS REFERENCE TO RELATED APPLICATION

This application claims the benefit of the Korean Patent Application No. 10-2011-0055876, filed on Jun. 10, 2011, which is hereby incorporated by reference as if fully set forth herein.

BACKGROUND OF THE DISCLOSURE

1. Field of the Disclosure

The present invention relates to flat display devices and method of fabricating the same, and more particularly to a flat display device which can make narrow bezel design easy and minimize resistance variation between adjacent link lines for improving a picture quality.

2. Discussion of the Related Art

Recently, many flat display devices are used as the display devices owing to their features of excellent picture quality, light, thin, and low power consumption. In the flat display devices, there are liquid crystal display devices, organic light emitting diode display devices, and the like, most of which are put into commercial use and come into market.

In the meantime, in order to provide a picture display area as large as possible in comparison to a size of the device, a small sized flat display device applied to a portable terminal, a notebook computer or so on requires a technology for making an area (a bezel area) excluding the picture display area smaller. Accordingly, the small sized flat display device has a gate driving unit and a data driving unit put into one integrated circuit, that are provided individually in a medium to large sized flat display device. That is, the small sized flat display device has all of the gate driving unit and the data driving unit integrated into a driving IC.

According to this, the driving IC has gate output terminals each for supplying a scan signal, and data output terminals each for supplying a data signal. The driving IC is connected to a picture display unit through a plurality of gate link lines and a plurality of data link lines, electrically. In this instance, the plurality of gate link lines connect the gate output terminals to the plurality of gate lines and the plurality of data link lines connect the data output terminals to the plurality of data lines.

In the meantime, in order to make the bezel area narrow, the related art flat display device has a dual link structure applied to the gate link lines provided on both sides of the picture display unit. The gate link lines of the dual link structure has a structure in which adjacent gate link lines are formed on layers different from each other. For an example, odd numbered gate link lines are formed as gate line metals at a first layer, and even numbered gate link lines are formed as gate line metals at a second layer which is a layer different from the first layer. The flat display device having the dual link structure applied thereto can make a width between the gate link lines small, enabling to design a width of the bezel area narrow, at the end.

However, the flat display device having the dual link structure applied thereto has the following problem. That is, since the odd numbered gate link lines and the even numbered gate link lines are formed on layers different from each other, a process variation is accompanied, in which thicknesses or line widths of the lines are formed different from one another. The process variation causes a great resistance variation between adjacent gate link lines, affecting the scan signal transmitted through the gate link lines making a picture quality poor.

SUMMARY OF THE DISCLOSURE

Accordingly, the present invention is directed to flat panel device and method of fabricating the same.

An object of the present invention is to provide a flat display device which can make narrow bezel design easy and minimize resistance variation between adjacent link lines for improving a picture quality.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flat display device includes a display region having a plurality of pixels, a driving integrated circuit for supplying driving signals for driving the plurality of pixels, and a plurality of link lines for transmitting the driving signals to the display region, wherein each of the plurality of link lines includes a first metal line, a second metal line formed on a layer different from the first metal line, and a contact portion for connecting the first and second metal lines to each other; and wherein, a portion of any one link line between the driving integrated circuit and its contact portion is one of the first metal line and the second metal line, while a portion of another link line adjacent to the one link line between the driving integrated circuit and its contact portion is the other of the first metal line and the second metal line.

To achieve these objects and other advantages and in accordance with the purpose of the invention, as embodied and broadly described herein, a method of fabricating flat display device comprising: forming a plurality of link lines for transmitting driving signals to a display region having a plurality of pixels on a substrate, wherein forming each of the plurality of link lines includes: forming a first metal line on the substrate, forming a second metal line formed on a layer different from the first metal line, and forming a contact portion for connecting the first and second metal lines to each other; and wherein, forming the plurality of link lines, such that a portion of any one link line between its contact portion and the display region is one of the first metal line and the second metal line, while a portion of another link line adjacent to the one link line between its contact portion and the display region is the other of the first metal line and the second metal line; and mounting a driving integrated circuit for supplying the driving signals for driving the plurality of pixels on the substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
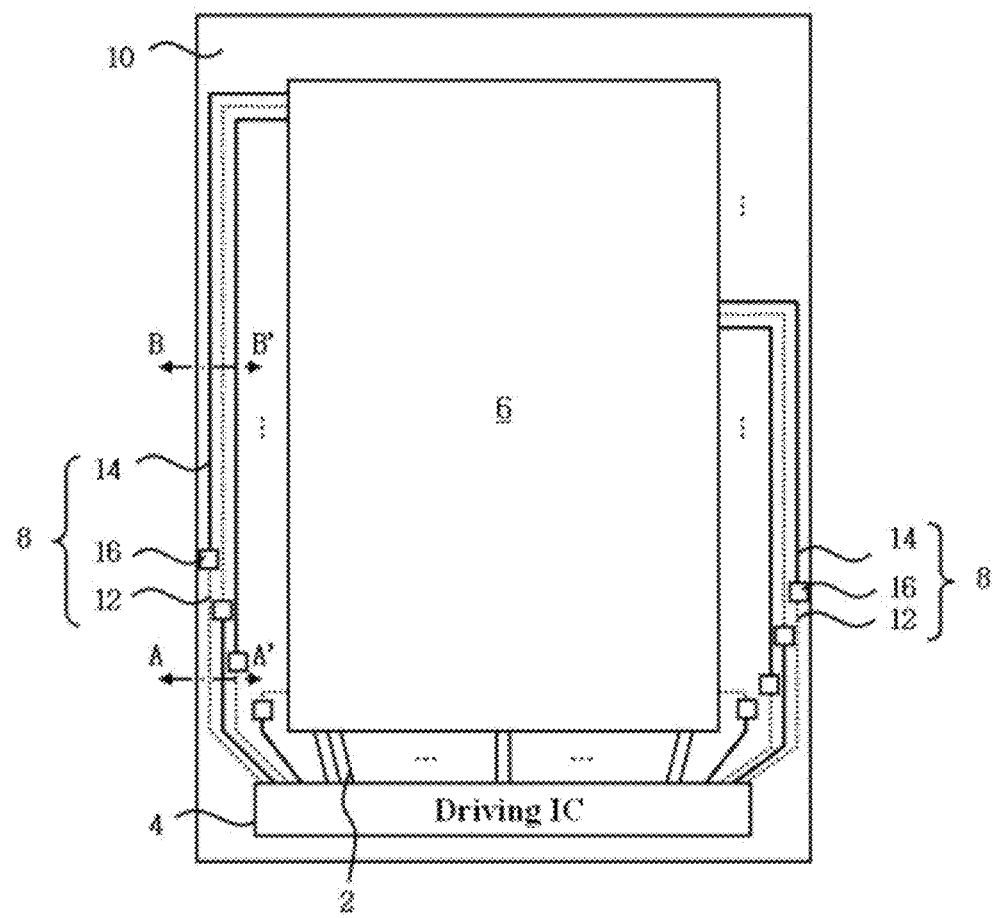
FIG. 1 illustrates a schematic view of a flat display device in accordance with a preferred embodiment of the present invention.

FIG. 1 illustrates a schematic view of a flat display device in accordance with a preferred embodiment of the present invention.

Referring to FIG. 1, the flat display device includes a substrate 10, a display region 6, a driving IC 4, and a plurality of link lines 2 and 8.

The display region 6 has a plurality of gate lines and a plurality of data lines. Defined at crossed portions of the plurality of gate lines and the plurality of data lines, there are pixels. In the meantime, there is a gate pad provided to one side of the gate lines for receiving a scan signal, and there is a data pad provided to one side of the data lines for receiving a data signal.

The driving IC 4 supplies driving signals for driving a plurality of pixels. That is, the driving IC 4 has both of a gate driving unit and a data driving unit integrated thereto. The driving IC 4 supplies the scan signal for driving the plurality of the gate lines and the data signal for driving the plurality of data lines.

The plurality of link lines 2 and 8 include a plurality of gate link lines 8 and a plurality of data link lines 2.

The plurality of gate link lines 8 transmits the scan signal from the driving IC 4 to the plurality of gate lines. To do this, the plurality of gate link lines 8 have one side with a scan signal output terminal of the driving IC 4 connected thereto and the other side with the gate pad of the display region 6 connected thereto.

The plurality of data link lines 2 transmits the data signal from the driving IC 4 to the plurality of data lines. To do this, the plurality of data link lines 2 have one side with a data signal output terminal of the driving IC 4 connected thereto and the other side with the data pad of the display region 6 connected thereto.

In the meantime, the plurality of link lines 2 and 8 of the embodiment have the dual link structure applied thereto. The dual link structure will be described in detail.

Figure 2:
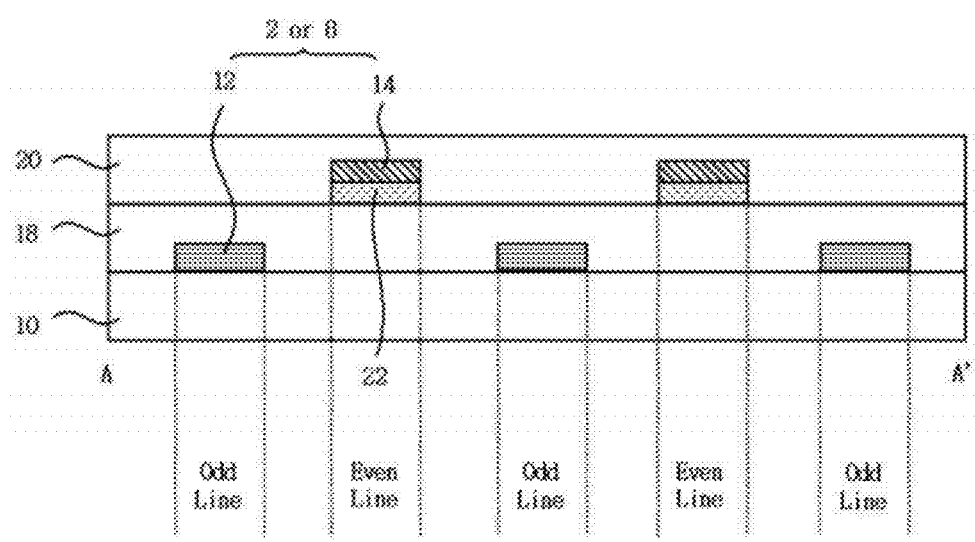
FIG. 2 illustrates a section across an A-A' line in FIG. 1.
Figure 3:
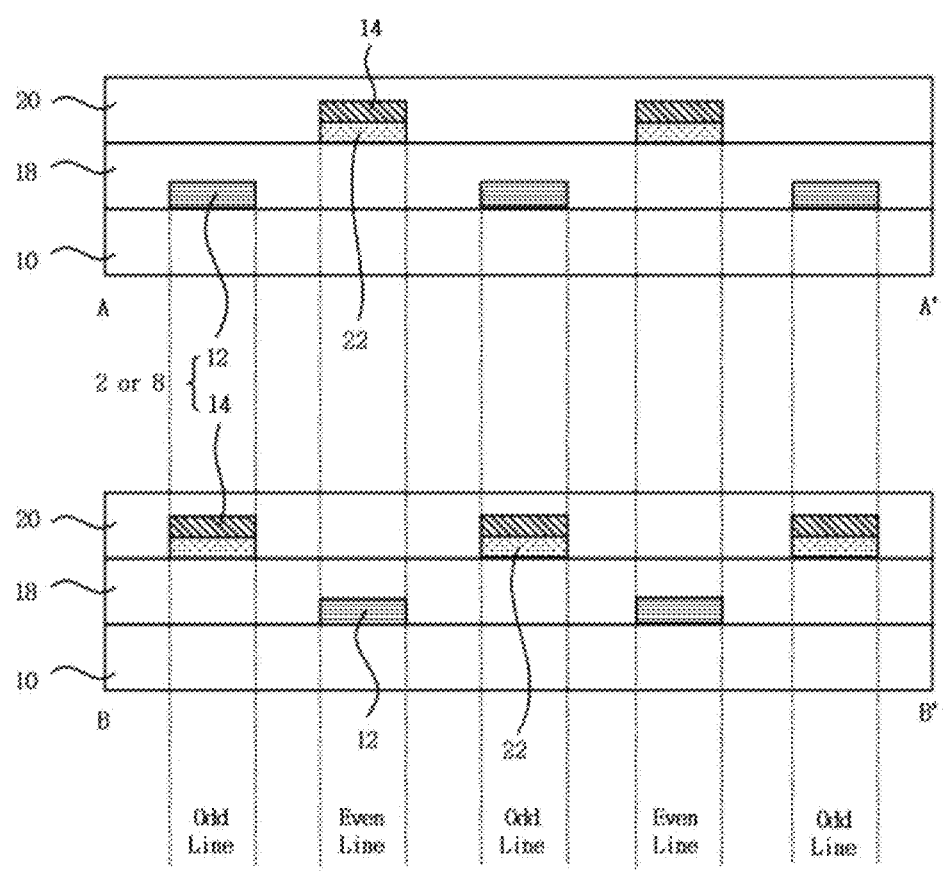
FIG. 3 illustrates sections across an A-A' line and a B-B' line in FIG. 1.

FIG. 2 illustrates a section across an A-A' line in FIG. 1, and FIG. 3 illustrates sections across an A-A' line and a B-B' line in FIG. 1.

Referring to FIG. 2, the plurality of link lines 2 and 8 have adjacent lines formed on layers different from each other. That is, odd numbered link lines 2 and 8 and even numbered link lines 2 and 8 are formed on layers different from each other. For an example, as shown in an A-A' section, the odd numbered link lines 2 and 8 can be formed on a lower layer and the even numbered link lines 2 and 8 can be formed on an upper layer. According to this, the embodiment enables to form a width between the link lines 2 and 8 narrow, making so called narrow bezel design easy.

In the meantime, in order to make the link lines 2 and 8 having the dual link structure applied thereto to have the same resistance, widths and heights of the link lines 2 and 8 on the upper layer and the link lines 2 and 8 on the lower layer are designed to have the same. However, despite of such a design, a process error is liable to take place. If there is the process error taken place, the widths and the heights of the link lines 2 and 8 on the upper layer and the link lines 2 and 8 on the lower layer are different from each other. Then, resistance between the link lines 2 and 8 on the upper layer and the link lines 2 and 8 on the lower layer becomes different, to cause a poor picture quality.

The embodiment suggests applying the dual link structure to each of the plurality of link lines 2 and 8 for preventing the problem from taking place, in which each of the plurality of link lines 2 and 8 are formed to have double layers.

In detail, each of the link lines 2 and 8 have a first metal line 12 formed on the lower layer and a second metal line 14 formed on the upper layer, and the first metal line 12 and the second metal line 14 are connected through a contact portion 16.

That is, each of the link lines 2 and 8 is constructed from the first metal line 12 on the lower layer, the second metal line 14 on the upper layer, and the contact portion 16 which connects the first metal line 12 to the second metal line 14.

Above will be described with reference to FIG. 3. An A-A' section illustrates the link lines 2 and 8 provided between the driving IC 4 and the contact portion 16 and a B-B' section illustrates the link lines 2 and 8 provided between the contact portion 16 and the display region 6.

As described before, in the A-A' section, the odd numbered link lines 2 and 8 are formed as the first metal lines 12, and the even numbered link lines 2 and 8 are formed as the second metal lines 14.

As illustrated in the B-B' section, the link lines 2 and 8 jump through the contact portion 16 such that the odd numbered link lines 2 and 8 are formed as the second metal lines 14, and the even numbered link lines 2 and 8 are formed as the first metal lines 12.

Thus, the embodiment suggests that corresponding portions of the link lines 2 and 8 adjacent to each other are formed on layers different from each other while each of the link lines 2 and 8 have the dual structure. That is, by arranging the first and second metal lines 12 and 14 provided to adjacent link lines 2 and 8 alternately, the widths between the lines are made narrow.

For an example, the first metal line 12 provided to each of the odd numbered link lines 2 and 8 connects the driving IC 4 to the contact portion 16, and the second metal line 14 provided to each of the odd numbered link lines 2 and 8 connects the contact portion 16 to the display region 6. And, the second metal line 14 provided to each of the even numbered link lines 2 and 8 connects the driving IC 4 to the contact portion 16, and the first metal line 12 provided to each of the even numbered link lines 2 and 8 connects the contact portion 16 to the display region 6.

According to this, the driving signals are supplied to the display region 6 through the first metal lines 12, the contact portions 16, and the second metal lines 14, respectively. Of course, opposite to this, the driving signals from the driving IC 4 are supplied to the display region 6 through the second metal lines 14, the contact portions 16 and the first metal lines 12, too respectively.

Figure 4:
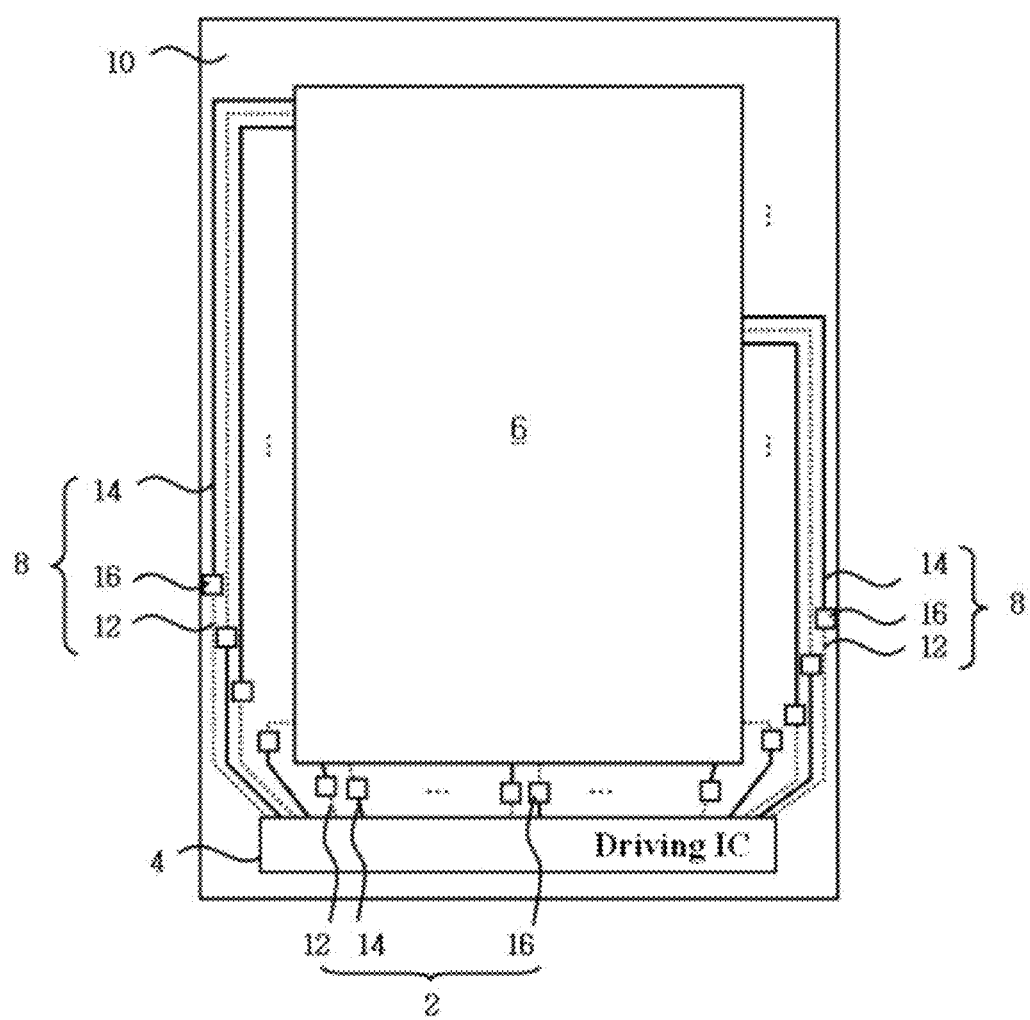
FIG. 4 illustrates a schematic view of a flat display device in accordance with another preferred embodiment of the present invention.

Thus, the link lines 2 and 8 of the embodiment have the dual link structure applied thereto while each of the link lines 2 and 8 have a double layered structure. As shown in FIG. 4, characteristics of the link lines 2 and 8 can be applied, not only to the gate link lines 8, but also to the data link lines 2.

In the meantime, as described before, if the link lines 2 and 8 have the dual link structure applied thereto while each of the link lines 2 and 8 have a double layered structure, the resistance variation between the link lines 2 and 8 can be minimized under the following reasons.

Figure 5A:
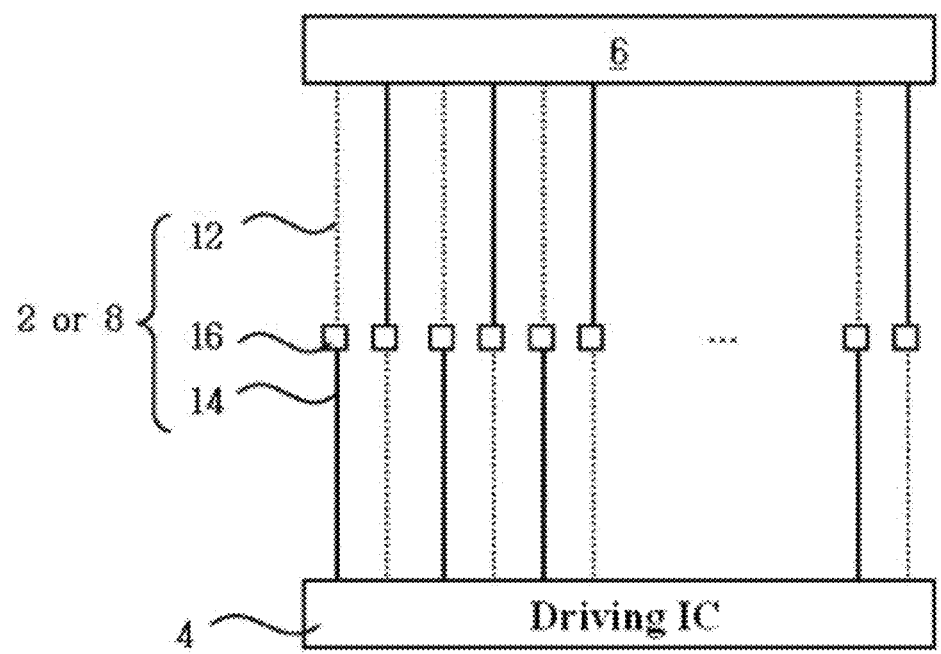
FIGS. 5A and 5B illustrate schematic views of link lines in accordance with another preferred embodiment of the present invention, respectively.
Figure 5B:
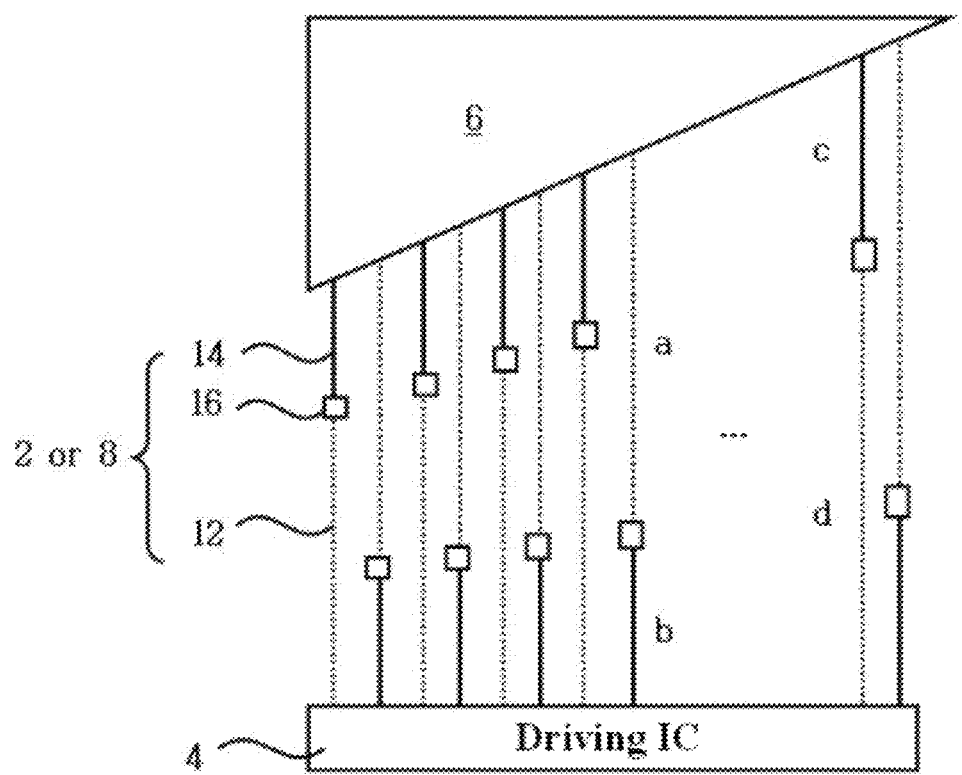

FIGS. 5A and 5B illustrate schematic views of link lines 2 and 8 in accordance with another preferred embodiment of the present invention, respectively. In detail, FIG. 5A illustrates a schematic view of an ideal form of the link lines 2 and 8, and FIG. 5B illustrates a schematic view of a practical form of the link lines 2 and 8.

Referring to FIG. 5A, each of the link lines 2 and 8 connects the driving IC 4 to the display region 6, wherein all of the link lines 2 and 8 are assumed to be straight lines and have the same length. In this instance, it is assumed that each of the contact portions 16 is positioned at middle of each of the link lines 2 and 8 such that the first and second metal lines 12 and 14 have the same length.

For an example, if the first metal line 12 has an increased resistance and the second metal line 14 has a decreased resistance due to the process variation between the first and second metal lines 12 and 14 of which resistances required to be the same, this phenomenon will be applicable to all of the link lines 2 and 8. Therefore, the link lines 2 and 8 of the embodiment can have "0" resistance variation between adjacent link lines 2 and 8, ideally.

However, as shown in FIGS. 1 and 4, since all of actual link lines 2 and 8 have different lengths, design is required to differ.

In detail, referring to FIG. 5B, actually embodied link lines 2 and 8 have linearly increased lengths.

The embodiment suggests that the lengths of the first and second metal lines 12 and 14 provided to the link lines 2 and 8 set different from one another for minimizing the resistance variation between adjacent link lines 2 and 8, and a ratio of the lengths of the first and second metal lines 12 and 14 is designed the same. In this instance, it is preferable that distances between the contact portions 16 and the driving IC 4 are set to be different from each other.

Eventually, though each of the link lines 2 and 8 of the embodiment has different lengths of the first and second metal lines 12 and 14, since the ratio of the lengths of the first and second metal lines 12 and 14 is the same, the resistances of the plurality of the link lines 2 and 8 do not increase, sharply.

$$R = \rho \times (L/A) \quad (1)$$

where, R denotes line resistance, ρ denotes resistivity, L denotes a length, and A denotes a sectional area.

$$R = R_1 + R_2 \quad (2)$$

$$R_1 = \rho_1 \times \frac{L_1}{A_1}$$

$$R_2 = \rho_2 \times \frac{L_2}{A_2}$$

where, R denotes link line resistance, R1 denotes a first metal line resistance, and R2 denotes a second metal line resistance.

In detail, referring to equation 1, the resistance of the link line 2 and 8 is proportional to the resistivity, and inversely proportional to a cross sectional area.

Accordingly, the resistance of the link line 2 and 8 can be a sum of a first resistance of the first metal line 12 and a second resistance of the second metal line 14. In this instance, resistance of the contact portion 16 are not taken into account. Even if taken into account, since the resistance of the contact portion 16 is applied to all of the link lines 2 and 8, the resistance of the contact portion 16 does not influence to the resistance variation.

In view of equation 2, the resistivity and the cross sectional areas of the first and second metal lines 12 and 14 are applicable to all of the link lines 2 and 8 in common. At the end, resistance of the link line 2 and 8 is dependent on lengths of the first and second metal lines 12 and 14. Since the embodiment suggests the first and second metal lines 12 and 14 to have the same ratio of lengths, the resistance of the link lines 2 and 8 increase linearly with the lengths thereof. That is, since the lengths of the link lines 2 and 8 increase linearly from the first link line 2 and 8 to the last link line 2 and 8, the embodiment can prevent the resistance from varying sharply between adjacent link lines 2 and 8, to prevent the picture quality from becoming poor, like cross lines.

In the meantime, most ideally, the resistance is required to be the same even if all of the link lines 2 and 8 have lengths different from one another. Accordingly, the length ratios of the link lines 2 and 8 of the embodiment can be set to be the same while adjusting the cross sectional areas of the first and second metal lines 12 and 14.

That is, cross sectional areas of the first and second metal line is formed to be gradually greater as it goes from a first link line to a last link line. In the case, the widths of the first and second metal line are formed to be gradually greater as it goes from a first link line to a last link line. The heights of the first and second metal lines are formed to be gradually greater as it goes from a first link line to a last link line. For example, the first and second metal lines 12 and 14 provided to an (n)th link line 2 and 8 have cross sectional areas set greater than the cross sectional areas of the first and second metal lines 12 and 14 provided to the an (n−1)th link line 2 and 8. Of course, the setting is on the assumption that the length of the (n)th link line 2 and 8 is longer than the length of the (n−1)th link line 2 and 8, and the length ratios between the first and second metal lines 12 and 14 provided to all the link lines 2 and 8 are the same.

Consequently, since, though the lengths of the link lines 2 and 8 are increased, since the cross sectional areas increase as much, the resistance becomes almost the same, to reduce the resistance variation between adjacent link lines 2 and 8, further.

In the meantime, the embodiment can be applicable both to a case where materials of the first and second metal lines 12 and 14 are the same or to a case where materials of the first and second metal lines 12 and 14 different from each other.

For an example, the first metal line 12 can be formed at the time of formation of the gate line in the display region 6, of one or two or more than two metals or an alloy of metals selected from aluminum Al, aluminum neodymium AlNd, molybdenum Mo, chrome Cr, and copper Cu. And, the second metal line 14 can be formed at the time of formation of the data line in the display region 6, of one or two or more than two metals or an alloy of metals selected from aluminum Al, aluminum neodymium AlNd, molybdenum Mo, chrome Cr, and copper Cu.

Figure 6:
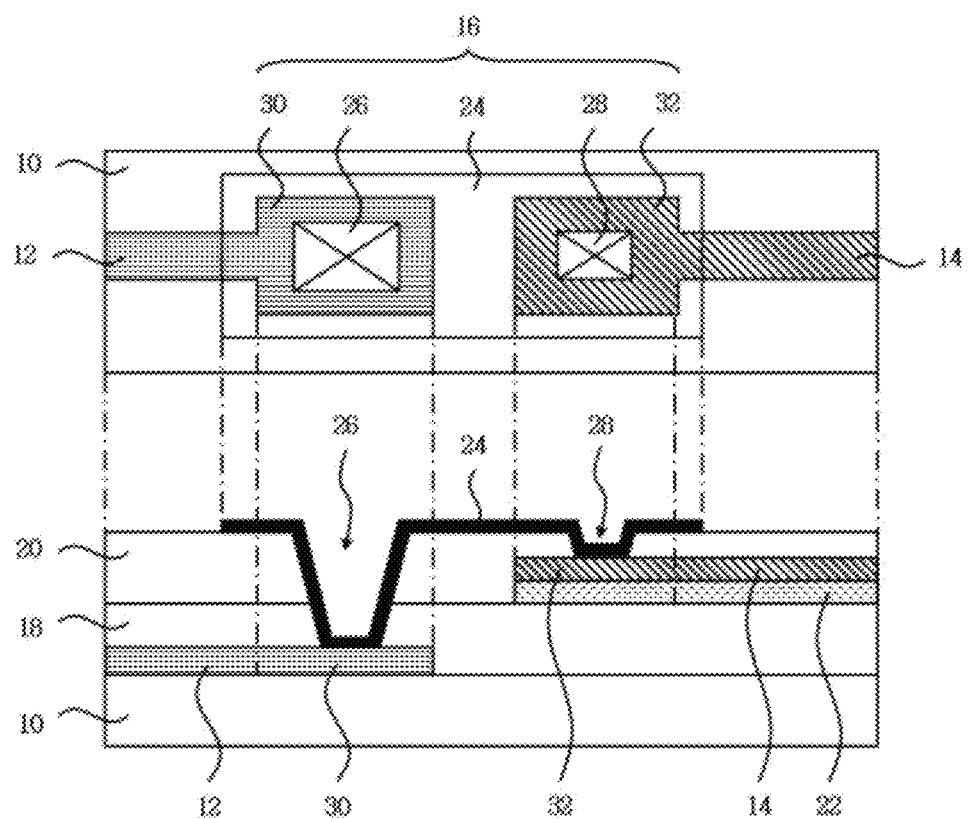
FIG. 6 illustrates a plan view and a section of a contact portion in accordance with another preferred embodiment of the present invention, respectively.

FIG. 6 illustrates a plan view and a section of a contact portion 16 in accordance with another preferred embodiment of the present invention, respectively.

Referring to FIG. 6, the contact portion 16 includes a first metal pad 30 formed on the substrate 10, a gate insulating layer 18 formed on an entire surface of the substrate 10 including the first metal pad 30, an etch stopper film 22 and a second metal pad 32 formed on the gate insulating layer 18 in succession, a protective layer 20 formed on an entire surface of the substrate 10 including the second metal pad 32, a first contact hole 26 passed through the protective layer 20 and the gate insulating layer 18 to expose the first metal pad 30, a second contact hole 28 passed through the protective layer 20 to expose the second metal pad 32, and a contact electrode 24 formed to cover the first and second contact holes 26 and 28.

The first metal pad 30 is an extension from the first metal line 12, and the second metal pad 32 is an extension from the second metal line 14.

The etch stopper film 22 is formed of one of semiconductor material and ITO (Indium Tin Oxide). The etch stopper film 22 formed of semiconductor material is formed at the time of formation of the semiconductor layer in the display region 6. The etch stopper film 22 and the semiconductor layer in the display region 6 can be formed at the time of formation of the data line, the second metal line 14, and the second metal pad 32 using a half-tone mask, to reduce a number of mask process. The etch stopper film 22 can be removed depending on fabricating methods.

The contact electrode 24 can be formed of a conductive electrode material, such as ITO (Indium Tin Oxide), but not limited to this.

In the meantime, a stacking material and a stacking order of the contact portion 16 in FIG. 6 can vary with the fabrication methods.

The following is a method of fabricating the present invention. The gate line in the display area 6, the first metal line 12 and the first metal pad 30 are formed on the substrate 10. And then, the gate insulating layer 18 is formed to cover the first metal line 12 and the first metal pad 30. And then, the etch stopper film 22, the data line in the display area 6, the second metal line 14 and the second metal pad 32 are formed on the gate insulating layer 18. And then, the protective layer 20 is formed on the gate insulating layer 18 having the etch stopper film 22, the second metal line 14 and the second metal pad 32. And then, the first contact hole 26 is formed through the protective layer 20 and the gate insulating layer 18, and the second contact hole 28 is formed through the protective layer 20 and exposes the second metal pad 32. On the other hand, if the second metal pad 32 and the second metal line 14 may be formed of a metal that can easily dry-etched, such as Mo, etc., then the second contact hole 28 is formed to expose the etch stopper film 22. This is caused by a fact that the second contact hole 28 is formed through the protective layer 20 and the second metal pad 32 while the first contact hole 26 is formed through the protective layer 20 and the gate insulating layer 18. And then, the contact electrode 24 is formed on the protective layer 20. And then, the driving integrated circuit 4 is mounted on the substrate 10.

Figure 7A:
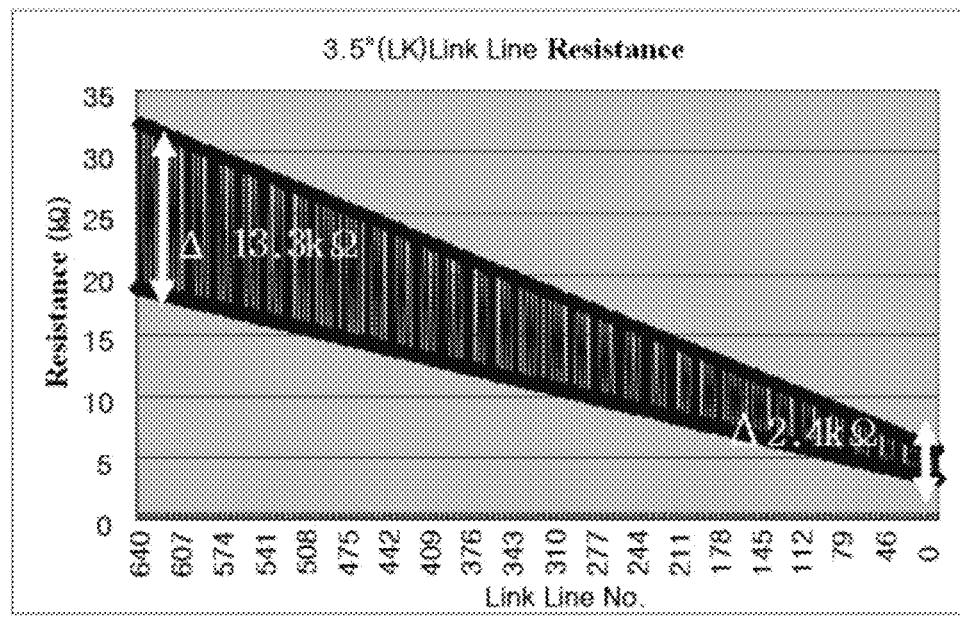
FIGS. 7A and 7B illustrate graphs showing simulations for describing an effect of the present invention, respectively.
Figure 7B:
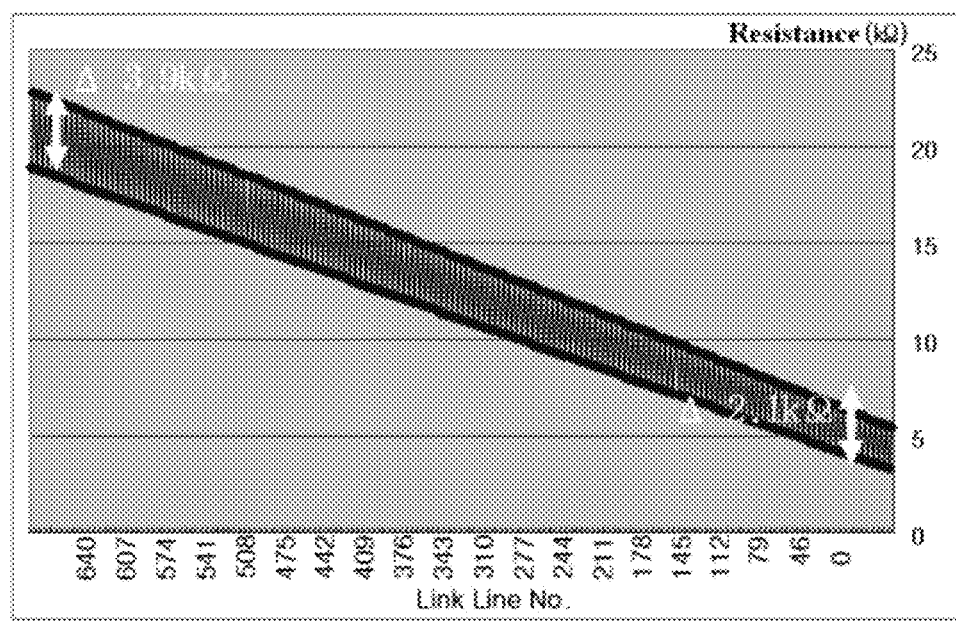

FIGS. 7A and 7B illustrate graphs showing simulations for describing an effect of the present invention, respectively. In detail, FIG. 7A illustrates a graph showing a simulation on the related art flat display device, and FIG. 7B illustrates a graph showing a simulation on a flat display device in accordance with a preferred embodiment of the present invention.

Referring to FIG. 7A, it can be known that the flat display device having the related art dual link structure applied thereto has a greatest resistance variation of 13.3Ω between adjacent link lines, with the resistance variation increased from 2.4Ω to 13.3Ω starting from a first link line to a last link line.

Referring to FIG. 7B, it can be known that the flat display device of the present invention has the greatest resistance variation of 3.9Ω between adjacent link lines, with the resistance variation increased from 2.1Ω to 3.9Ω starting from the first link line to the last link line.

Thus, the flat display device of the present invention can make a narrow bezel design easy by applying the dual link structure thereto, and can minimize the resistance variation between adjacent link lines by providing the first and second metal lines provided to layers different from each other and the contact portion which connects the first and second metal lines to each other. Eventually, the flat display device of the present invention can prevent a poor picture quality liable to cause by the resistance variation between adjacent link lines from taking place, thereby improving the display quality.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A flat display device comprising:
a display region including left and right vertical sides, and top and bottom horizontal sides, and having a plurality of gate lines and a plurality of data lines;
a driving integrated circuit for supplying driving signals for driving a plurality of pixels; and
a plurality of link lines for transmitting the driving signals to the display region, the plurality of link lines having at least a first link line and a second link line adjacent to the first link line,
wherein the first link line is positioned outside of the second link line with respect to the display region,
wherein the first link line includes:
a first metal line connected to the driving integrated circuit,
a second metal line connected to the display region and formed on a layer different from the first metal line, and
a first contact portion for connecting the first and second metal lines to each other,
wherein the second link line includes:
a third metal line connected to the driving integrated circuit,
a fourth metal line connected to the display region and formed on a layer different from the third metal line,
a second contact portion for connecting the third and fourth metal lines to each other, and
wherein the first metal line is formed on the same layer as the fourth metal line, and the second metal line is formed on the same layer as the third metal line,
wherein the first metal line has a length that is greater than a length of the third metal line, the fourth metal line has a length that is greater than a length of the second metal line, and the first contact portion is separated from the driving IC by a first distance that is larger than a second distance separating the second contact portion from the driving IC, wherein a vertical portion of the second metal line is directly connected to the first contact portion and parallel to the left vertical side of the display region, and a horizontal portion of the second metal line is connected to the first contact portion via a corner having a 90 degree angle and perpendicular to the left vertical side, the vertical portion of the second metal line being longer than the horizontal portion of the second metal line, and wherein a vertical portion of the fourth metal line is directly connected to the second contact portion and parallel to the left vertical side of the display region, and a horizontal portion of the fourth metal line is connected to the second contact portion via a corner having a 90 degree angle and perpendicular to the left vertical side, the vertical portion of the fourth metal line being longer than the horizontal portion of the fourth metal line.

2. The flat display device as claimed in claim 1, wherein, the resistances of the plurality of link lines are substantially the same as each other.

3. The flat display device as claimed in claim 2, wherein, cross sectional areas of the plurality of link lines are formed to be gradually greater from the shortest link line to the longest link line.

4. The flat display device as claimed in claim 1, wherein the plurality of link lines includes either or both of gate link lines for transmitting scan signal from the driving integrated circuit to gate lines in the display region and data link lines for transmitting data signal from the driving integrated circuit to data lines in the display region.

5. The flat display device as claimed in claim 1, wherein, the first contact portion includes:
a first metal pad which is an extension from the first metal line;
a gate insulating layer formed to cover the first metal pad and the first metal line;
a second metal pad which is an extension from the second metal line on the gate insulating layer;
a protective layer formed on the gate insulating layer having the second metal pad and the second metal line;
a first contact hole passing through the protective layer and the gate insulating layer to expose the first metal pad;
a second contact hole passing through the protective layer to expose the second metal pad; and
a contact electrode formed to cover the first contact hole and the second contact hole, to connect the first and second metal lines to each other.

6. The flat display device as claimed in claim 5, wherein, the first contact portion further includes an etch stopper film between the gate insulating layer and the second metal pad.

7. The flat display device as claimed in claim 1, wherein, the second contact portion includes:
a fourth metal pad which is an extension from the fourth metal line;
a gate insulating layer formed to cover the fourth metal pad and the fourth metal line;
a third metal pad which is an extension from the third metal line on the gate insulating layer;
a protective layer formed on the gate insulating layer having the third metal pad and the third metal line;
a first contact hole passing through the protective layer and the gate insulating layer to expose the fourth metal pad;
a second contact hole passing through the protective layer to expose the third metal pad; and
a contact electrode formed to cover the first contact hole and the second contact hole, to connect the third and fourth metal lines to each other.

8. The flat display device as claimed in claim 7, wherein, the second contact portion further includes an etch stopper film between the gate insulating layer and the third metal pad.

9. The flat display device as claimed in claim 1, wherein the plurality of link lines are a plurality of gate link lines, respectively.

\* \* \* \* \*